United States Patent [19]

Murazumi et al.

[11] Patent Number: 5,399,233
[45] Date of Patent: Mar. 21, 1995

[54] METHOD OF AND APPARATUS FOR MANUFACTURING A SEMICONDUCTOR SUBSTRATE

[75] Inventors: Maki Murazumi; Yoshihiro Arimoto; Atsushi Fukuroda, all of Kawasaki, Japan

[73] Assignee: Fujitsu Limited, Kawasaki, Japan

[21] Appl. No.: 969,290

[22] PCT Filed: Dec. 4, 1992

[86] PCT No.: PCT/JP92/01586

§ 371 Date: Feb. 1, 1993

§ 102(e) Date: Feb. 1, 1993

[30] Foreign Application Priority Data

Dec. 5, 1991 [JP] Japan ................... 3-320809

[51] Int. Cl.6 .................................. H01L 21/306
[52] U.S. Cl. ................... 156/635; 437/228; 156/636
[58] Field of Search ............. 437/228; 156/635, 636; 51/283 R

[56] References Cited

U.S. PATENT DOCUMENTS

| | | | |
|---|---|---|---|
| 4,735,679 | 4/1988 | Lasky | 156/636 |
| 4,879,258 | 11/1989 | Fisher | 156/636 |
| 5,081,796 | 1/1992 | Schultz | 51/283 R |

FOREIGN PATENT DOCUMENTS

| | | |
|---|---|---|
| 62-78260 | 5/1987 | Japan . |
| 62-199354 | 9/1987 | Japan . |
| 64-7548 | 1/1989 | Japan . |
| 1-136328 | 5/1989 | Japan . |
| 2-177435 | 7/1990 | Japan . |
| 2-237066 | 9/1990 | Japan . |
| 2-257629 | 10/1990 | Japan . |
| 3-104223 | 5/1991 | Japan . |
| 3-104224 | 5/1991 | Japan . |
| 3-108356 | 5/1991 | Japan . |
| 3-145129 | 6/1991 | Japan . |
| 3-180070 | 8/1991 | Japan . |
| 3-259521 | 11/1991 | Japan . |

OTHER PUBLICATIONS

W. J. Patrick et al., "Application of Chemical Mechanical Polishing to the Fabrication of VLSI Circuit Interconnections", J. Electrochem. Soc., vol. 138, No. 6, Jun. 1991, pp. 1778-1784.
Translation of Miyajima JP 3-108356.
Translation of Usui Shoji et al. JP 3-145129.
Translation of Nemoto et al. JP 2-257629.
Translation of Arimoto JP 2-237066.
Translation of Ogawa JP 62-199354.
"A Computer Controlled Polishing System for Silicon-on-Insulator (SOI)", Yamada et al, 5th International Workshop on Future Electron Devices-Three Dimensional Integration-(FED 3D Workshop), May 30-Jun. 1, 1988, Miyagi-Zao, pp. 201-205.

Primary Examiner—Brian E. Hearn
Assistant Examiner—Lynne A. Gurley
Attorney, Agent, or Firm—Nikaido, Marmelstein, Murray & Oram

[57] ABSTRACT

In a process of manufacturing a semiconductor substrate having a SOI (silicon on insulator) structure, grooves are formed in a silicon layer reduced in thickness to several microns so that the silicon layer is separated into island-like regions corresponding to a chip size or device regions, and a stopper having a thickness corresponding to a desired final thickness of the silicon layer is formed in the grooves. The silicon layer is scanned with a piece of polishing cloth which has an area larger than that of each island-like region but sufficiently smaller than that of silicon layer and which is attached to a pressing surface of the polishing jig, thereby polishing the silicon layer until the stopper is exposed. The thickness of the silicon layer is measured at a position such that the thickness of a portion thereof is measured immediately before the same portion is polished. The pressure applied to the polishing cloth or the rotational speed of the polishing jig is controlled on the basis of thickness data thereby obtained. The thickness of a silicon layer having a diameter of 6 inches was thereby reduced uniformly to 0.1 to 1 μm.

9 Claims, 4 Drawing Sheets

METHOD OF AND APPARATUS FOR MANUFACTURING A SEMICONDUCTOR SUBSTRATE

TECHNICAL FIELD

This invention relates to a semiconductor substrate having a SOI (silicon on insulator) structure and, more particularly, to a method of polishing one of two silicon wafers attached to each other through an insulation layer so that the polished silicon wafer is formed as a thin layer having a uniform thickness of about 1 μm or less.

BACKGROUND ART

With the increase in the density of packaging of semiconductor integrated circuits (ICs), the development of practical SOI substrates is being promoted. It is anticipated that SOI substrates will be used as an effective means for avoiding an increase in parasitic capacitance of transistors in high density ICs and occurrence of a latch-up phenomenon or the like in CMOS transistors.

In one method for manufacturing SOI substrates, two silicon wafers are attached with an SiO$_2$ layer interposed therebetween, and in which one of the two silicon wafers is polished so that the thickness thereof is reduced to a predetermined value. If an ordinary polishing machine is used for this polishing, it is impossible to avoid the occurrence of non-uniformity in the reduced thickness of the polished silicon wafer to an extent of 1 μm or more in terms of total thickness variation (TTV), However, to realize desired device characteristics, in particular, a high-speed operation of a MOS FET, a substrate in which the thickness of a silicon layer is 0.1 to 1 μm is required. Further, with respect to SOI substrates for integrated circuits formed of fine CMOS elements having a channel length of 1 μm or less, a thin silicon layer having a thickness of, for example, 0.05 μm (500 Å) is required. Therefore, it is impossible for existing polishing machines to uniformly reduce the thickness of the whole of a silicon wafer having a diameter of, for example, 6 inches.

As methods for solving such problems relating to the accuracy of polishing machines, various methods have been proposed in which a stopper formed of a material more difficult to polish in comparison with silicon and having a predetermined thickness is formed in a silicon layer previously reduced in thickness to several microns, and in which the final thickness is controlled with such a stopper. This kind of method utilizes the difference between polishing speeds, for examples, of silicon and silicon oxide and is called selective polishing.

A stopper formed of a SiO$_2$ layer having a thickness of 0.1 μm or less, for example, is embedded around chip regions or device formation regions defined in a silicon layer to be reduced in thickness to several microns. The silicon layer is polished so that the same thickness as that of the stopper. (Methods of this type are disclosed in Japanese Patent Laid-Open Publication Nos. 1-136328, 2-237066, 3-104224, and 3-108356).

FIG. 4 is a schematic cross-sectional view of an example of the above-described method. A silicon wafer 1 attached to another silicon wafer 2 forming a supporting substrate with an SiO$_2$ layer 3 interposed therebetween is previously formed as a thin layer having a thickness of 3 to 4 μm, and a stopper 4 is formed of an SiO$_2$ layer in regions where no devices will be formed.

The silicon wafer 2 is fixed on a polishing jig 5 and is rotated on a rotating shaft 5A while being pressed against an upper surface of a surface table 6. A piece of polishing cloth 7 formed of, for example, polyurethane in which a silica sand powder is mixed is attached to the upper surface of the surface table 6. In this state, an abrasive is supplied to the upper surface of the surface table 6 to polish the silicon wafer 1 until the stopper 4 is exposed. In this manner, the silicon wafer 1 is polished and formed into a thin layer having a thickness of 1 μm corresponding to that of the stopper 4.

However, if the silicon wafer 1 and the surface table 6 are not parallel to each other, the silicon wafer 1 is not polished uniformly and a state is exhibited in which the stopper 4 is exposed in a portion of the silicon wafer 1 so that the polishing speed is reduced, although the stopper 4 is not exposed yet in the other portion, as shown in FIG. 4(a). If polishing is further continued under this condition, a portion of the silicon wafer 1 is excessively polished so that the thickness thereof is smaller than that of the stopper 4. Thus, polishing may be performed while failing to make the stopper 4 function suitably. This is mainly because of an elastic deformation of the polishing cloth 7. A necessary condition for forming the silicon wafer 1 into a thin layer uniform through the entire polished area is that, when the stopper is partially exposed, the thickness of the wafer at the portion where the stopper is not exposed is also sufficiently reduced. That is, the variation in the thickness of the wafer 1 must be kept small in the selective polishing region in order to make the stopper function effectively.

DISCLOSURE OF THE INVENTION

An object of the present invention is to form a SOI substrate such as that described above so as to form a thin uniform substrate layer by effectively utilizing the function of stopper 4.

FIG. 1 is a diagram of the principle of a method of polishing a semiconductor substrate in accordance with the present invention. A SOI substrate 10 is placed on a surface table 8. The SOI substrate 10 is formed of a silicon wafer 2 forming a supporting substrate, and a silicon wafer 1 attached to the silicon wafer 2 with an SiO$_2$ layer 3 interposed therebetween. The silicon wafer 1 is previously polished to have a thickness of about 3 to 4 μm, and grooves 1B are formed in the silicon wafer 1 so that island-like regions 1A each having a size (area) corresponding to a semiconductor chip are defined. For example, a stopper 4 formed of SiO$_2$ and having a thickness of 1 μm is formed in each groove 1B. A polishing cloth 7 such as that used in the conventional method (see FIG. 4) is not attached the upper surface of the surface table 8.

The silicon wafer 1 of the substrate 10 placed on the surface table 8 is polished with a polishing jig 11. For example, the polishing jig 11 is a cylinder having a diameter larger than the size of each island-like region 1A and capable of rotating on an axis 11A perpendicular to the upper surface of the surface table 8. A sheet of polishing cloth 12 having approximately the same diameter as the polishing jig 11 and formed of, for example, polyurethane in which a fine silica sand powder is mixed is attached to a pressing surface of the polishing jig 11 facing the upper surface of the surface table 8. The surface of the silicon wafer 1 is uniformly scanned with the polishing jig 11 while the polishing cloth 12 is pressed on the silicon wafer 1. The entire surface of the silicon wafer 1 is polished until the stopper 4 is exposed. For example, this scanning is performed by moving the polishing jig 11 in directions along X- and Y-axes while fixing the surface table 8 or by rotating the surface table 8 while moving the polishing jig 11 on a straight line passing through the center of rotation of the surface table 8.

BEST MODE FOR CARRYING OUT THE INVENTION

Figure 1:
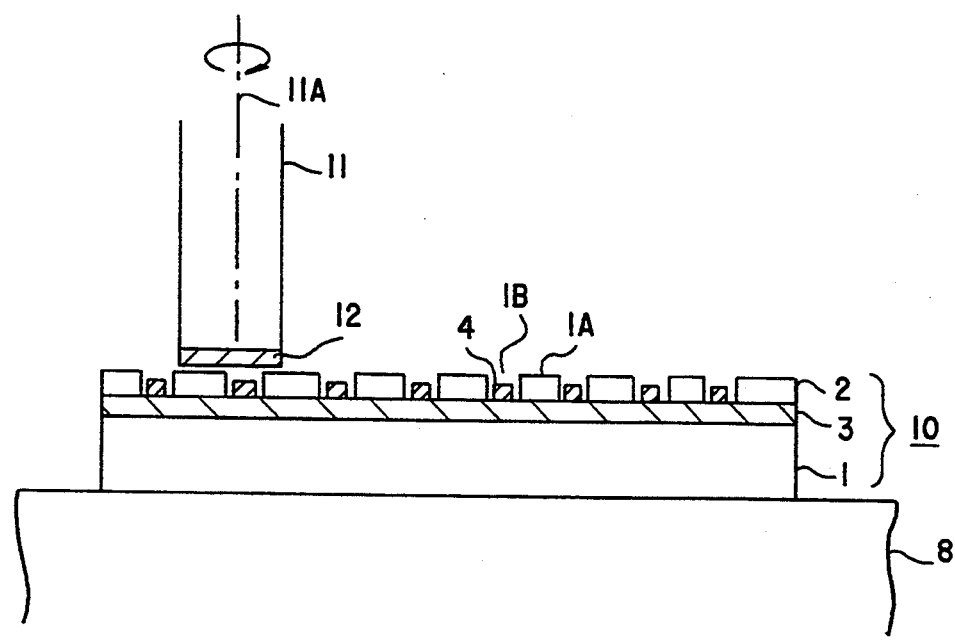
FIG. 1 is a diagram of the principle of a method of polishing a semiconductor substrate in accordance with the present invention.

An embodiment of the present invention will be described below with reference to the accompanying drawings. In the figures referred to hereinbelow, portions identical or corresponding to those in the figures referred to in the above are indicated by the same reference characters.

Figure 2D:
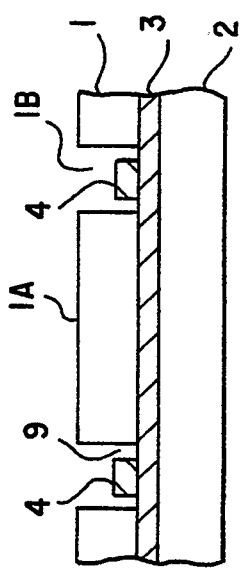
FIGS. 2(a) to 2(e) are diagrams of a process in accordance with an embodiment of the present invention.
Figure 2E:
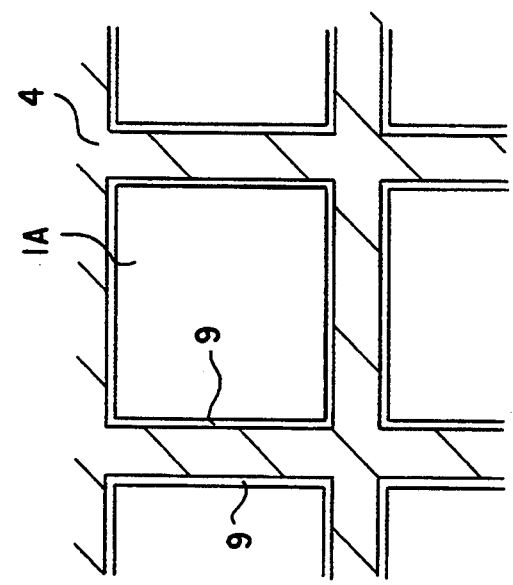
Figure 2A:

FIGS. 2(a) to 2(e) are diagrams of a process in accordance with the embodiment of the present invention. As shown in FIG. 2(a), a silicon wafer 1 having, for example, a diameter of 6 inches (150 mm) and a thickness of 500 mm is attached to another silicon wafer 2 forming a supporting substrate with a $SiO_2$ layer 3 interposed therebetween. Thereafter, the silicon wafer 1 is reduced in thickness to, for example, 10 $\mu$m by grinding or the like and is polished by an ordinary polishing method using an abrasive such as colloidal silica to be formed as a thin layer having a thickness of 3 to 4 $\mu$m.

Figure 2B:
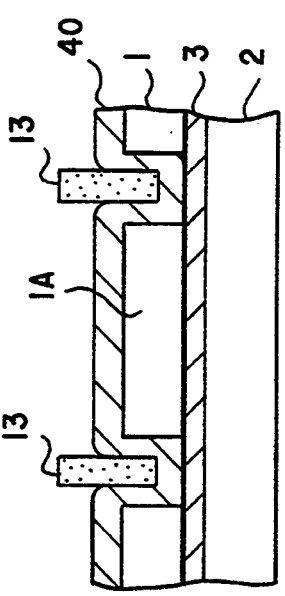

Then, as shown in FIG. 2(b), the silicon wafer 1 is etched by using a well-known photolithography technique so as to form grooves 1B from its surface to a position on the $SiO_2$ layer 3. The silicon wafer 1 is thereby separated into island-like regions 1A. Each island-like region 1A may have any shape between a size corresponding to a chip region having one side of about 10 mm and a size corresponding to a device region having one side of about 10 $\mu$m. The width (W) of each groove 1B is set in the range between 0.1 $\mu$m and 1 to 2 mm according to the size of the island-like regions 1A.

Figure 2C:
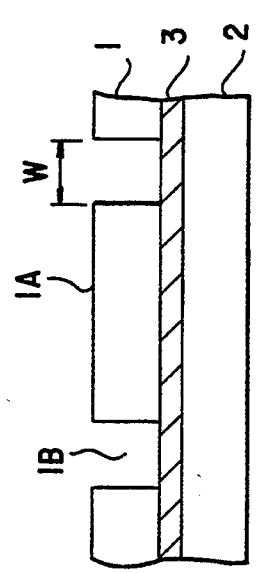

Thereafter, as shown in FIG. 2(c), a $SiO_2$ layer 40 is deposited over the entire surface of the silicon wafer 1, for example, by the well-known chemical vapor deposition (CVD) method. The thickness of the $SiO_2$ layer 40 is selected according to the kind of devices formed on the island-like regions 1A. In a case where MOS transistors are formed on the land-like regions 1A, the $SiO_2$ layer 40 has a thickness of about 0.1 $\mu$m. In a case where bipolar transistors are formed on the island-like regions 1A, the $SiO_2$ layer 40 has a thickness of about 1 $\mu$m or greater. Needless to say, the thickness of the $SiO_2$ layer 40 is smaller than that of the silicon wafer 1.

A resist mask 13 corresponding to the grooves 1B is then formed on the $SiO_2$ layer 40 and portions of the $SiO_2$ layer 40 exposed from the resist mask 13 is selectively etched. In this manner, a stopper 4 having a predetermined thickness is formed on a portion of the $SiO_2$ layer 3 exposed in the grooves 1B, as shown in FIG. 2(d) and a corresponding plan view of FIG. 2(e). If the stopper 4 is formed so that gaps 9 are formed between the stopper 4 and side walls of the island-like regions 1A as illustrated, the thickness of the island-like regions 1A can be conveniently measured with a probe type level difference meter.

Figure 3:
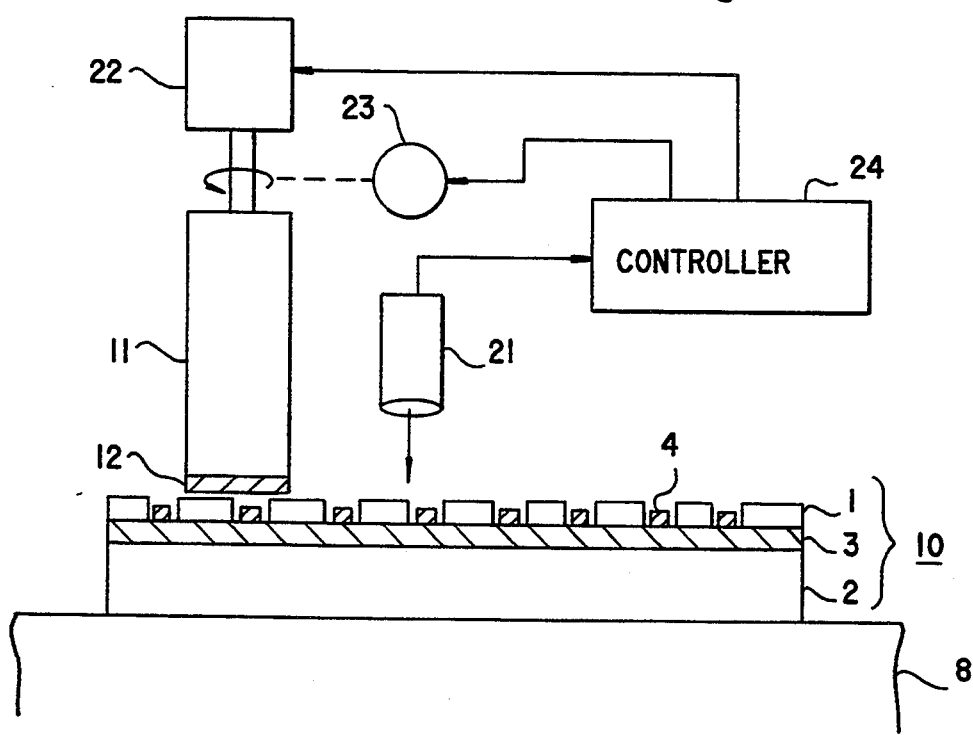
FIG. 3 is a diagram of a semiconductor substrate polishing machine in accordance with the embodiment of the present invention.

The SOI substrate 10 in which stopper 4 is formed as described above is polished by using a polishing machine shown in FIG. 3. An essential portion of this polishing machine is constructed as described above with reference to FIG. 1. In FIG. 3 are illustrated a reflection type thickness measuring device 21 for measuring the thickness of the silicon wafer 1, for example, by using visible or infrared light, a pressing mechanism 22 for pressing the polishing cloth 12 against the silicon wafer 1, a motor 23 for rotating the polishing jig 11, and a controller 24 for controlling the pressure of the pressing mechanism 22 and the rotational speed of the motor 23.

The thickness measuring device 21 is moved along the surface of the silicon wafer 1 together with the jig 11 to measure, during this movement, the thickness of the silicon wafer 1 at a position such that the wafer 1 is polished by the polishing jig 11 immediately after the thickness measurement. Data on the result of this measurement is supplied to the controller 24. The controller 24 constantly updates the thickness measurement data supplied in correspondence with scanning over the entire silicon wafer 1 surface and calculates an average thickness. The controller 24 compares a thickness measurement value of a portion to be polished next with the average value at the present time, and controls the pressure of the pressing mechanism 22 or the rotational speed of the motor 23 on the basis of the result of this comparison.

That is, if the thickness measurement value is greater than the average value, the controller 24 increases the pressure of the pressing mechanism 22 or the rotational speed of the motor 23. If the thickness measurement value is smaller than the average value, the controller 24 reversely controls the corresponding factor.

The pressure of the pressing mechanism 22 and the rotational speed of the polishing jig 11 controlled in this manner are 0.1 to 0.5 kg/cm$^2$ and 60 to 500 rpm, respectively. During the above-described polishing, the surface table 8 is stopped or rotated at a speed of about several ten rpm. In the case of stoppage, the polishing jig 11 is moved for scanning on the surface of the silicon wafer 1 in the directions of the X- and Y-axes. In the case of rotation, the polishing jig 11 is reciprocatingly moved on a straight line passing through the center of rotation of the surface table 8.

Figure 4A:
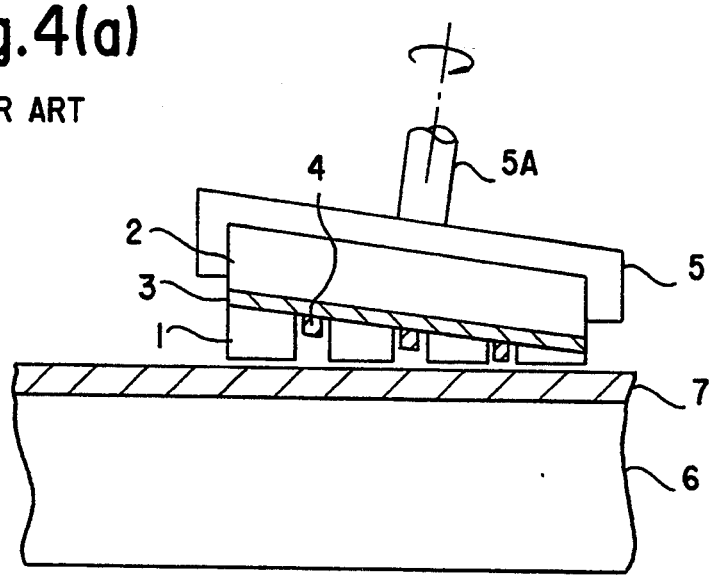
FIGS. 4(a) and 4(b) are diagrams for explaining the problem in the prior art.
Figure 4B:
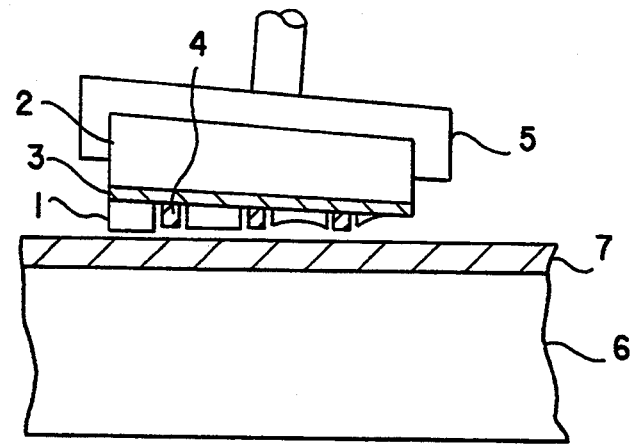
Figure 5:
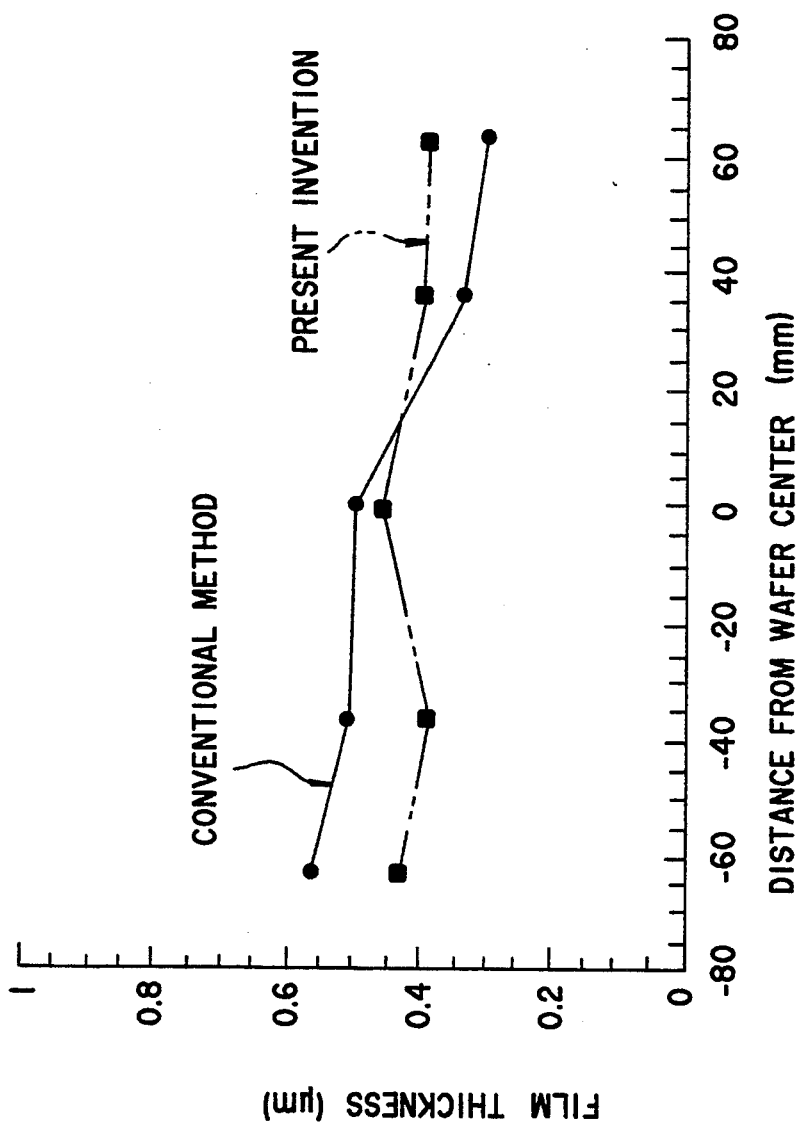
FIG. 5 is a graph of an example of an improvement in thickness uniformity attained by the invention.

FIG. 5 is a graph of a thickness distribution in cases where a silicon layer having a SOI structure and having a diameter of 150 mm is polished in accordance with the present invention. The abscissa represents the distance from the center of the substrate (mm), and the ordinate represents the layer thickness ($\mu$m). For comparison, a distribution of the thickness of a silicon layer polished by the conventional method shown in FIGS. 4(a) and 4(b). The result shown in FIG. 5 was obtained under the following conditions. That is, the size of island-like regions 1A was 4×4 mm; the width of grooves 1B was 0.5 mm; stopper 4 was formed of a 0.4 $\mu$m thick $SiO_2$ layer, the diameter of polishing cloth 7 was 4 cm; and the speed and the pressing force of the polishing jig 11 were 300 rpm and 300 g/cm², respectively. The surface table 8 was rotated at 60 rpm.

As shown in FIG. 5, while the conventional SOI substrate had a dispersion of ±30% with respect to a 0.45 μm thick silicon layer, a smaller dispersion, ±10% or less was exhibited with respect to a thickness of 0.4 μm in the case of the SOI substrate in accordance with the present invention.

According to the present invention, one of two wafers having a diameter of 6 to 8 inches attached to each other through an SiO₂ layer to form a SOI structure can be formed into a thin layer having a uniform thickness of 0.1 to several microns. Thus, the present invention is effective in promoting the development of practical high-density high-performance semiconductor integrated circuits.

In the above-described embodiment, a continuous groove 1B surrounding each island-like region 1A is formed in silicon layer 1, and stopper 4 is provided in the groove 1B. The structure may alternatively be such that groove 1B is separated into a plurality of discontinuous portions discretely formed around each island-like region 1A and stopper 4 is provided in each groove portion. Further, instead of stopper 4 provided after the formation of groove 1B, an oxide film is locally embedded in silicon wafer 1 to be used as a stopper before silicon wafer 1 is attached to silicon wafer 2 forming a supporting substrate.

Needless to say, the above-described groove and stopper can be applied to each of an arrangement in which island-like region 1A is a chip region defined in silicon layer 1 and an arrangement in which island-like region 1A is a device region defined in each chip region. The present invention can be applied effectively irrespective of the stopper forming method, the shape and the arrangement of the stopper.

A semiconductor substrate formed of a pair of silicon wafers attached to each other through an SiO₂ layer has been described as an embodiment in the above. However, the present invention is also effective in manufacturing a semiconductor substrate in which a wafer formed of a compound semiconductor such as gallium arsenide and a silicon wafer are attached to each other with an insulation layer interposed therebetween. In either type of semiconductor substrate formed of two silicon wafers or one silicon wafer and one compound semiconductor wafer, the layer interposed between the wafers is not limited to the SiO₂ layer or a single layer. The interposed layer may be other kinds of insulation layers, e.g., a layer of silicon nitride or silicon oxynitride, and may be a composite layer in which a plurality of insulation layers are laminated. Further, the interposed layer may include an insulation layer formed of a high dielectric material.

We claim:

1. A method of manufacturing a substrate including a plurality of semiconductor islands formed on a supporting substrate member with an insulation layer intervening therebetween, the semiconductor islands each having a selected size and a selected thickness, said method comprising the steps of:

forming a semiconductor layer on the supporting substrate member with the insulation layer intervening therebetween, the semiconductor layer having a thickness larger than the selected thickness;

forming grooves in a surface of the semiconductor layer so as to divide the semiconductor layer into a plurality of regions each corresponding to each of the semiconductor islands and having a size equal to the selected size of a corresponding semiconductor island;

selectively forming a stopper layer in the grooves, the stopper layer being formed from an insulating material harder to be polished than the semiconductor layer and having a thickness allowing the stopper layer to have a surface level higher than that of the insulation layer by a difference provided therebetween substantially equal to the selected thickness of each of the semiconductor islands;

selecting a polishing cloth so as to have a size which is larger in comparison with each of the regions in the semiconductor layer and is smaller than the semiconductor layer;

polishing the entire surface of the semiconductor layer by moving the polishing cloth along the surface of the semiconductor layer, while the polishing cloth is pressed down to the surface of the semiconductor layer by a force applied thereto and rotates at a rotational speed, until the semiconductor layer at each of the regions has a thickness which provides the semiconductor layer with a surface level substantially equal to that of the stopper layer.

2. A method according to claim 1, wherein the step of polishing comprises the substeps of:

measuring the thickness of the semiconductor layer at each of the regions immediately before when the polishing cloth moves to corresponding one of the regions; and controlling the force applied to the polishing cloth such that the force is reduced if the thickness measured is smaller than a comparison value, and is increased if the thickness measured is equal to or larger than the comparison value.

3. A method according to claim 1, wherein the step of polishing comprises the substeps of:

measuring the thickness of the semiconductor layer at each of the regions immediately before when the polishing cloth moves to corresponding one of the regions; and controlling the rotational speed of the polishing cloth such that the rotational speed is reduced if the thickness measured is smaller than a comparison value, and is increased if the thickness measured is equal to or larger than the comparison value.

4. A method according to claim 1, wherein the step of polishing comprises the substeps of:

fixing the supporting substrate member on a surface table so as to expose the surface of the semiconductor layer having the stopper layer; and rotating the surface table at a speed lower than the rotational speed of the polishing cloth.

5. A method according to claim 4, wherein said step of polishing comprises a substep of moving the polishing cloth on a straight line passing through the center of the surface table.

6. A method according to claim 1, wherein the step of forming the stopper layer comprises the substeps of:

depositing the insulating material on the surface of the semiconductor layer having the grooves formed therein, so as to form a layer having a thickness smaller than the thickness of the semiconductor layer;

forming a resist layer to selectively fill the grooves of the semiconductor layer on which surface the insulating material deposited;

selectively removing the insulating material exposed from the resist layer, then removing the resist layer in the grooves.

7. A method according to claim 1, wherein the step of polishing the semiconductor layer is conducted such that the polishing cloth moves along the surface of the semiconductor layer, while the semiconductor layer is at rest.

8. A method according to claim 1, wherein the supporting substrate member and the semiconductor layer are formed from silicon, while the insulation layer is formed from silicon oxide produced by thermally oxidizing a surface of at least one of the supporting substrate member and the semiconductor layer.

9. A method of manufacturing a substrate as recited in claim 1, wherein said polishing cloth is selected so as to have a size which is larger than each of the regions in the semiconductor layer, and wherein said polishing cloth has a size which is less than 30% of the size of the semiconductor layer.

* * * * *